United States Patent [19]

Kweon et al.

[11] Patent Number: 5,450,289
[45] Date of Patent: Sep. 12, 1995

[54] SEMICONDUCTOR PACKAGE AND A PRINTED CIRCUIT BOARD APPLICABLE TO ITS MOUNTING

[75] Inventors: Yooung D. Kweon, Seoul; Min C. An, Kyungki, both of Rep. of Korea

[73] Assignee: Samsung Electronics Co., Ltd., Suwon, Rep. of Korea

[21] Appl. No.: 206,179

[22] Filed: Mar. 7, 1994

[30] Foreign Application Priority Data

Mar. 5, 1993 [KR] Rep. of Korea ............. 93-3275

[51] Int. Cl.⁶ .................... H01R 9/00; H05K 1/18; H05K 7/02
[52] U.S. Cl. ......................... 361/773; 257/692; 257/696; 257/723; 257/779; 361/760; 361/772; 361/761; 361/764; 361/777; 361/779; 361/783; 439/68; 439/72; 439/78; 439/82; 439/83
[58] Field of Search ........... 174/260, 52.1, 52.4, 174/260; 228/179.1, 180.1, 180.21, 179.1, 180.1, 180.21; 257/690, 692, 693, 694, 696, 723, 724, 779; 361/760, 761, 763, 764, 772, 773, 777, 779, 783, 813, 820, 821; 437/203, 204, 209; 439/68, 70, 72, 78, 82, 83

[56] References Cited

U.S. PATENT DOCUMENTS 4,125,740 11/1978 Paletto ..................... 257/696

FOREIGN PATENT DOCUMENTS

| | | | |
|---|---|---|---|
| 63-208252 | 8/1988 | Japan ............. | 439/83 |
| 1-19753 | 1/1989 | Japan ............. | 361/760 |
| 1-270256 | 10/1989 | Japan ............. | 257/693 |
| 1-270390 | 10/1989 | Japan ............. | 228/180.1 |
| 1-305553 | 12/1989 | Japan ............. | 257/693 |
| 2-151095 | 6/1990 | Japan ............. | 439/83 |
| 2-201945 | 8/1990 | Japan ............. | 257/693 |
| 2-205350 | 8/1990 | Japan ............. | 257/652 |
| 3-29389 | 2/1991 | Japan ............. | 439/83 |
| 3-96292 | 4/1991 | Japan ............. | 439/83 |
| 4-184967 | 7/1992 | Japan ............. | 257/696 |
| 4-184990 | 7/1992 | Japan ............. | 361/783 |

OTHER PUBLICATIONS

IBM Technical Disclosure Bulletin "Surface-mounted Device On Circuitized Thermoformable Sheets" vol. 28 No. 5 Oct. 1985 pp. 2068 and 2069.

*Primary Examiner*—Donald A. Sparks
*Attorney, Agent, or Firm*—Robert A. Westerlund; Stephen R. Whitt; Charles R. Donohoe

[57] ABSTRACT

An arrangement for vertically mounting a semiconductor device to a substrate, e.g., a printed circuit board (PCB), in which a plurality of sequentially arranged external leads of the semiconductor device include at least three different sets of non-consecutive ones of the external leads which have laterally outwardly extending foot portions lying in respective, vertically spaced-apart planes, and in which the foot portions of first and second ones of the sets of non-consecutive external leads are respectively secured to respective first and second steps formed in one of a plurality of walls defining a cavity in the PCB, and a third set of the non-consecutive external leads are secured to a portion of a major surface of the PCB adjacent the cavity.

11 Claims, 3 Drawing Sheets

Fig. 1A (PRIOR ART)
Fig. 1B (PRIOR ART)
Fig. 1C (PRIOR ART)
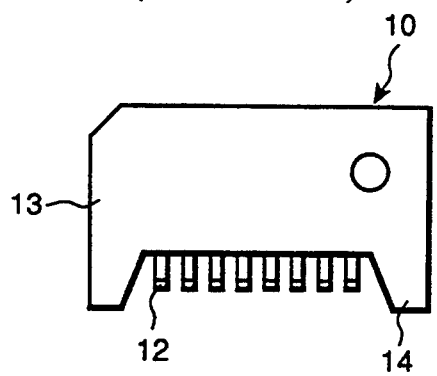
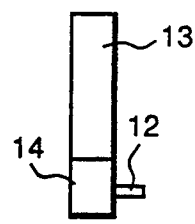
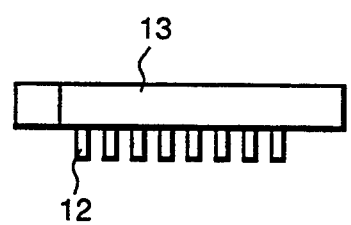
Fig. 2 (PRIOR ART)
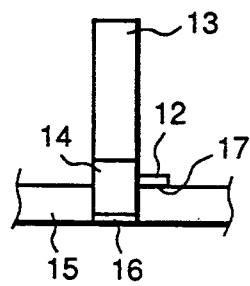
Fig. 3A (PRIOR ART)
Fig. 3B (PRIOR ART)
Fig. 3C (PRIOR ART)
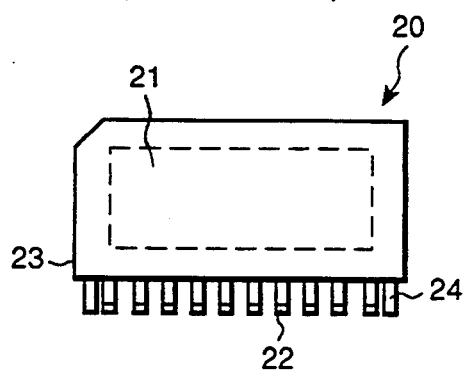
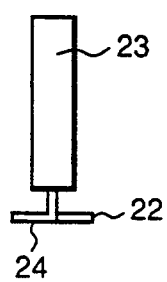
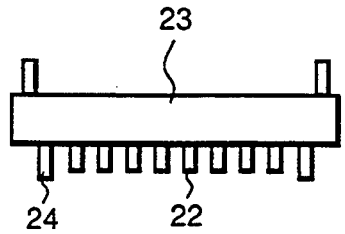

SEMICONDUCTOR PACKAGE AND A PRINTED CIRCUIT BOARD APPLICABLE TO ITS MOUNTING

FIELD OF THE INVENTION

The present invention relates to a semiconductor package and a printed circuit board (PCB) applicable to its mounting. More particularly, it relates to a semiconductor package which is capable of enhancing the mounting density of a semiconductor package and of ensuring reliability by removing noise due to an induced current which is occurred between adjacent external leads, and PCB applicable to its mounting.

BACKGROUND OF THE INVENTION

The development of semiconductor devices has led to the increase in the memory capacity of semiconductor chips, the number of I/O terminals signal computing speed, electric power consumption and the demand of higher mounting density.

Upon following the trend of large scale integration of the semiconductor chip, the number of leads has been increased and therefore the size of leads has been reduced. As a result it requires the various modification in packaging, semiconductor fabricating process.

The increase in the signal computing speed and electric power consumption leads to production of much heat in the semiconductor chips themselves. For heat radiation, a heat sink was separately installed in the body of the semiconductor packages from the highly heat-conductive material or the body of the semiconductor package was made from the highly heat-conductive material.

Furthermore, multi-layer packaging method and chip on board (COB) method, which is directly mounted on the PCB have been developed.

In general, the semiconductor package is widely used wherein semiconductor chips mounted on the die pad of lead frame and then package body is formed with molding materials. This molding type semiconductor package is divided into the horizontal and vertical mounting type.

The horizontal mounting type package is used in the thin memory card or the small personal computer and so on. And it is divided into SIP (single in line package) type where leads projects to one side of the body, DIP (dual in line package) and SOP (small out line package) type where leads projects to two sides of the body, and QFP (quad flat package) type where leads project to four sides all.

Besides, when the instrument needs lighter weight, larger capacity, and more speed to try to make the board be small by utilizing its space that components with various height coexist, the vertical mounting type package in which mounting method of semiconductor chips is mainly used like lead on chip (LOC) or chip on board (COL) is recently being watched with keen interest.

FIGS. 1A, 1B, and 1C are respectively a front, side and plane view showing a preferred embodiment of the vertical mounting type package according to the prior art.

Examples of the previous vertical mounting type package are described in U.S. Pat. No. 4,266,282 and 4,426,689. Referring to FIG. 1, among these the vertical packages (VPAK) has external leads 12 which are connected with semiconductor chips (not showed here) extended and banded to a direction on the one side of the package body 13 formed with molding material of epoxy molding compound (EMC) and so on.

Studs 14 to fix and support the package body 13 in mounting VPAK 10 is formed at the both sides of the package body 13. As shown in FIG. 2, studs 14 which are inserted in perforating holes 16 fix VPAK (10) and the down side of external bent leads 12 is vertically mounted soldered with the land pattern which is connected to the circuit formed on PCB 15.

Like above, VPAK which is mounted inserted in PCB has the problem that it has a difficulty in mounting both sides, forming multi-layer metallization, and performing batch reflow with other components. Especially, it has the shortcoming that perforating holes must be formed to fix studs on PCB.

FIGS. 3A, 3B, and 3C show the vertical surface mount package 20 (VSMP) which is developed by NEC Corporation to solve the problem. External leads 22 which are connected with semiconductor chip 21 are collectively extended from one side and unidirectionally bent.

Supporting leads 24 are more extended than the external leads 23 at both external sides and bent in zigzag type, that is, in 'L' type to support them in the vertical mounting of VSMP 20. Referring to FIG. 4, VSMP 20 is mounted by soldering the base of external leads 22 and supporting leads 24 on the land patterns (not shown here) which are connected with printed patterns on PCB 25 (not shown here).

Accordingly, the VSMP 20 has widely used owing to the merit of the possibility of high-density mounting and multi-layer metallization of PCB since it is a kind of surface mount package, both-side mounting on PCB, and batch reflow with other components of above external leads 23.

Moreover, in the prior vertically mounting type semiconductor package like the above-mentioned VPAK and VSMP, high integration of the semiconductor chip has led to increase in the number of I/O terminals of leads and therefore to requires the decrease in the distance of leads to 0.3 mm.

This fine pitch bring the semiconductor package to the low reliability problem that solder bridging phenomena due to the soldering equipment error in soldering process or the production error of semiconductor package and land patterns, or that noise due to the induction current between adjacent external leads occurs.

SUMMARY OF THE INVENTION

Therefore, it is an object of the present invention to provide a semiconductor package and A PCB applicable to its mounting with good reliability which prevent solder bridging phenomena occurred between external leads or land patterns of PCB in soldering reflow process for mounting of semiconductor packages regardless of fine pitch of the semiconductor package lead, and which prevent noise between the adjacent external leads.

To achieve the above object of the present invention, it is characterized by semiconductor package in which external leads are repeatedly bent to at least two layers with different height are downwardly extended from one base side of the package to be vertically mounted on PCB.

And also, there is provided a semiconductor package which includes a depressive groove having at least one stepped part, external leads repeatedly bent to at least two types, and at least one land pattern which is formed on the plane of the stepped part to be electrically connected to external leads of the semiconductor package.

BRIEF DESCRIPTION OF THE DRAWINGS

The above objects and other advantages of the present invention will become more apparent by the detailed description of the preferred embodiments thereof with reference to the attached drawings in which:

FIGS. 1A, 1B, and 1C are respectively a front, side, and plane view showing a preferred embodiment of the vertical mounting type semiconductor package according to the prior art.

FIG. 2 is a cross-sectional view showing the vertical mounting type semiconductor package of FIG. 1 which is mounted on the land pattern of PCB.

FIGS. 3A, 3B and 3C are respectively a front, side, and plane view showing a preferred embodiment of the vertical mounting type package according to the prior art.

DETAILED DESCRIPTION OF THE PREFERRED EMBODIMENTS

Figure 4:
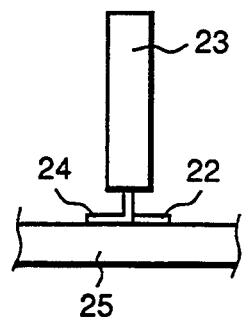
FIG. 4 is a cross-sectional view showing the vertical mounting type semiconductor package of FIG. 3 which is mounted on the land pattern of PCB.
Figure 5A:
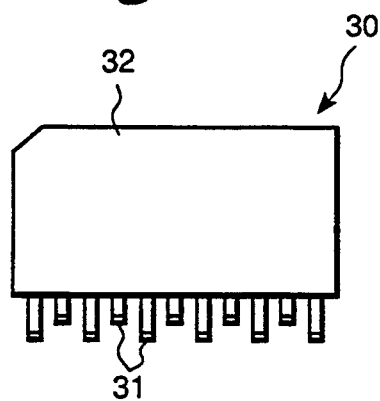
FIGS. 5A, 5B, and 5C are respectively a front, side, and plane view showing a preferred embodiment of the vertical mounting type package according to present invention.
Figure 5B:
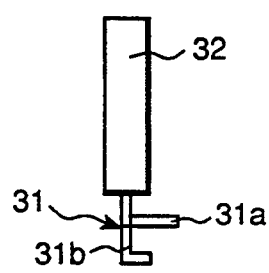
Figure 5C:
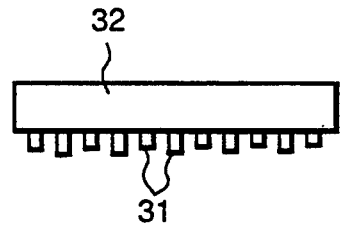

FIGS. 5A, 5B and 5C show the front, side, and plane view of the one preferred embodiment of the vertical mounting type semiconductor package of the present invention.

Referring to FIG. 5, the vertically mounting type semiconductor package 30 is such constructed that a pair of external leads 31a, 31b is constructed to be connected with the semiconductor chip (not shown) to be downwardly extended from the base side of the package body 32 molded in molding material—for example, EMC—, and are respectively have the stair plane with a different height bent to a direction. At this time, the semiconductor chip can be mounted on the die pad to be connected with the leads, or to be mounted with LOC and COL method.

Figure 6:
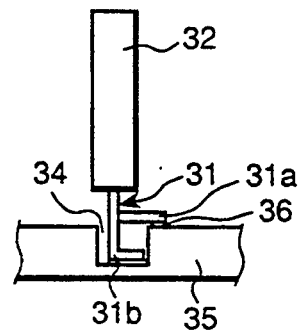
FIG. 6 is across sectional view showing one preferred embodiment of the vertical mounting type semiconductor package of FIG. 5 which is mounted on the land pattern of PCB.

In the mounted state of VSMP 30 as shown in FIG. 6, the depressive grooves 34 is formed to insert the external lead 31b on the one side surface of the PCB 35 on which circuit pattern (not shown here) is formed. The external lead 31a is mounted on the land pattern of the PCB 35 to be electrically by soldering process.

The distance between the adjacent external leads 31 is twice the original connected distance because the adjacent external leads are formed with two layer. For example, the distance of the adjacent external leads is 0.6 mm, while the original distance is 0.3 mm.

It is obvious that the lead distance may be farther when the adjacent leads 31 of VSMP 30 are bent with zigzag type to both directions.

Figure 7:
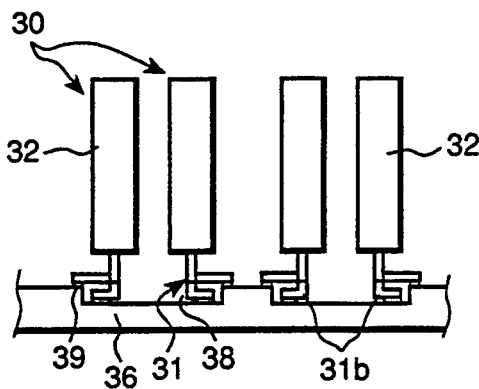
FIG. 7 is a cross-sectional view showing another preferred embodiment of the vertical mounting type semiconductor package of FIG. 5 which is mounted on the land pattern of PCB.

The mounting method of VMSP 30 can be variously modified as other embodiments shown in FIG. 7. That is to say, the adjacent depressive groove 38 is formed on the PCB 36 on which circuit patterns (not shown) are formed, and the semiconductor package 30 is mounted on the land pattern 39 which is formed to be electrically connected with the external lead 31 on the top surface of PCB 36 and the surface of the depressive groove 38. On one depressive groove 38, two external leads 31b which is downwardly extended from the base of package body 32.

Figure 8:
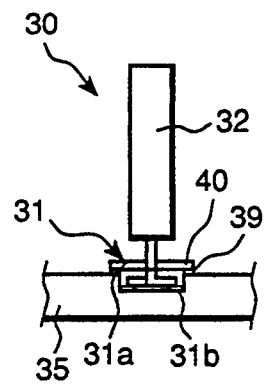
FIG. 8 is a cross-sectional view showing the vertical mounting type semiconductor package which is mounted on the land pattern of PCB with the additional supporting lead.

This VMSP 30 can be additionally employed with another supporting leads 40 to support the package body 32 as shown in FIG. 8. The supporting lead 40 is extended from both sides of the package body 32 on which the external leads are extended, and it is bent with zigzag type to both sides and in equal height to one of the upper 31a or down external lead 31b.

In this embodiment, the supporting lead 40 is bent with equal height to the upper external lead 31a and interconnected on the top surface of the PCB 35 to support the semiconductor package 30 in the soldering reflow process.

Figure 9A:
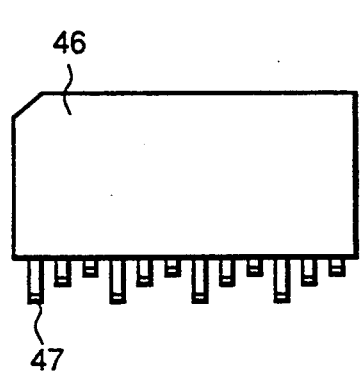
FIGS. 9A, 9B and 9C are respectively a front, side, and plane view showing still another preferred embodiment of the vertical mounting type semiconductor package according to the prior art.
Figure 9B:
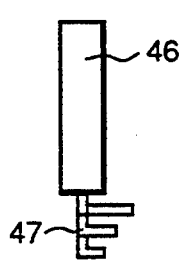
Figure 9C:
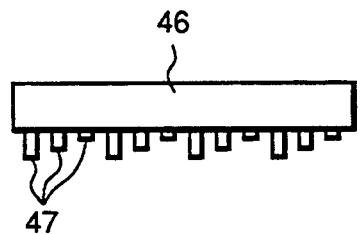

FIGS. 9A, 9B and 9C are respectively the front, side, and plane view which shows still another embodiment of VMSP according to the present invention. Referring to FIG. 9A through 9C, the VMSP 45 is such formed that external leads 47 are downwardly extended from the one side of the package body 46 molded in molding material, EMC and so on, and at least three adjacent leads are repeatedly bent to a direction with three stages.

Figure 10:
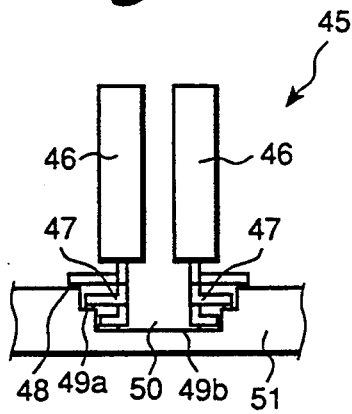
FIG. 10 is a cross-sectional view showing the vertical mounting type semiconductor package of FIG. 9 which is mounted on the land pattern of PCB.

This semiconductor package 45 is mounted on the PCB 51 as shown in FIG. 10, on which circuit patterns (not shown) and land pattern 48 and the depressive groove 50 with two stairs plane 49a and 49b are formed on its top surface. The external lead 47 which is bent with three stages is soldered on the land pattern 48 which is formed on the PCB 51 and the stages 49a and 49b.

Alternatively, the VMSP 45 (not shown) can be additionally equipped with another supporting leads and the external leads 47 of it can be bent to both sides as explained above.

As mentioned above, external leads are extended from one side of the package body and adjacent external leads are differently bent to have at least two stages such that the VMSP can be vertically mounted on the PCB, which includes the depressive grooves to insert the external leads, the land patterns which is formed to match with the external leads.

As a result, the present invention has the merit that prevents the solder bridging phenomena between adjacent external leads or land patterns regardless of fine pitch of the semiconductor package lead.

The present invention has also the merit that prevents the noise due to an induced current between adjacent external leads to improve the reliability of semiconductor devices.

As mentioned above, a semiconductor package and a PCB applicable to its mounting according to the present invention is constructed to have a semiconductor package having the adjacent external leads repeatedly bent to at least two or three stages, the PCB which has the depressive groove with at least two or three stepped parts, and the land pattern which is formed on the stepped surface in the depressive groove.

Accordingly it is obvious that present invention can be modified variously regardless of these embodiments without departing from the spirit and scope of the invention as defined by the appended claims.

What is claimed is:

1. A combination, comprising:
   a substrate having a cavity formed therein, a first one of a plurality of walls defining said cavity having a plurality of steps formed therein;
   a semiconductor device disposed in a vertical orientation relative to said substrate, said semiconductor device having a lateral edge proximate said cavity, and a plurality of external leads projecting vertically beyond said lateral edge towards said cavity and arranged sequentially along a longitudinal dimension of said lateral edge, with adjacent ones of said external leads being spaced apart;
   wherein a first set of non-consecutive ones of said external leads each have a laterally outwardly extending foot portion lying in a first plane and secured to a first one of said steps;
   wherein a second set of non-consecutive ones of said external leads each have a laterally outwardly extending foot portion lying in a second plane and secured to a second one of said steps;
   wherein a third set of non-consecutive ones of said external leads each have a laterally outwardly extending foot portion lying in a third plane and secured to a first portion of a major surface of said substrate adjacent to said cavity;
   wherein said first, second, and third planes are vertically spaced-apart from one another; and,
   wherein said semiconductor device is supported in said vertical orientation by means of said external leads.

2. The combination as set forth in claim 1, wherein said substrate comprises a printed circuit board (PCB).

3. The combination as set forth in claim 2, wherein said printed circuit board includes a wiring pattern which includes a plurality of bonding pads sequentially arranged along a longitudinal dimension of each of said first and second steps, and along said first portion of said major surface proximate said cavity, in correspondence to said foot portions of said first set of external leads, said second set of external leads, and said third set of external leads, respectively, with respective ones of said foot portions of said first set of external leads being soldered to respective ones of said bonding pads disposed on said first step, and respective ones of said foot portions of said second set of external leads being soldered to respective ones of said bonding pads disposed on said second step, and respective ones of said foot portions of said third set of external leads being soldered to respective ones of said bonding pads disposed on said first portion of said major surface proximate said cavity.

4. The combination as set forth in claim 1, further comprising:
   a plurality of steps formed in a second one of said plurality of walls defining said cavity;
   a second semiconductor device disposed in a vertical orientation relative to said substrate, and in parallel, spaced-apart relation to said first semiconductor device, said second semiconductor device having a lateral edge proximate said cavity, and a plurality of spaced-apart external leads projecting vertically beyond said lateral edge towards said cavity and sequentially arranged in along a longitudinal dimension of said lateral edge of said second semiconductor device;
   wherein a first set of non-consecutive ones of said external leads of said second semiconductor device each have a laterally outwardly extending foot portion lying in said first plane and secured to a first one of said steps formed in said second one of said walls defining said cavity;
   wherein a second set of non-consecutive ones of said external leads of said second semiconductor device each have a laterally outwardly extending foot portion lying in said second plane and secured to a second one of said steps formed in said second one of said walls defining said cavity;
   wherein a third set of non-consecutive ones of said external leads of said second semiconductor device each have a laterally outwardly extending foot portion lying in said third plane and secured to a second portion of said major surface of said substrate adjacent to said cavity; and,
   wherein said second semiconductor device is supported in said vertical orientation by means of said external leads.

5. The combination as set forth in claim 4, wherein said substrate comprises a printed circuit board.

6. The combination as set forth in claim 5, wherein said wiring pattern of said printed circuit board further includes a plurality of bonding pads sequentially arranged along a longitudinal dimension of each of said first and second steps of said second one of said walls defining said cavity, and along said second portion of said major surface proximate said cavity, in correspondence to said foot portions of said first, second, and third sets of external leads of said second semiconductor device, respectively, with respective ones of said foot portions of said first set of external leads of said second semiconductor device being soldered to respective ones of said bonding pads disposed on said first step of said second one of said walls defining said cavity, and respective ones of said foot portions of said second set of external leads of said second semiconductor device being soldered to respective ones of said bonding pads disposed on said second step of said second one of said walls defining said cavity, and respective ones of said foot portions of said third set of external leads of said second semiconductor device being soldered to respective ones of said bonding pads disposed on said second portion of said major surface proximate said cavity.

7. The combination as set forth in claim 4, wherein said foot portions of said first, second, and third sets of external leads of said first semiconductor device extend laterally outwardly in a first direction, and said foot portions of said first, second, and third sets of external leads of said second semiconductor device extend laterally outwardly in a second direction opposite said first direction.

8. The combination as set forth in claim 7, wherein said substrate comprises a printed circuit board.

9. The combination as set forth in claim 4, wherein said second one of said plurality of walls defining said cavity is opposite said first one of said plurality of walls defining said cavity.

10. A combination, comprising:

a substrate having a cavity formed therein;

a semiconductor device disposed in a vertical orientation relative to said substrate, said semiconductor device having a lateral edge proximate said cavity, and a plurality of external leads projecting vertically beyond said lateral edge towards said cavity and arranged sequentially along a longitudinal dimension of said lateral edge in spaced-apart relationship to one another;

wherein a first set of non-consecutive ones of said external leads each have a foot portion which extends laterally outwardly in a first direction and which lies in a first plane;

wherein a second set of non-consecutive ones of said external leads each have a foot portion which extends laterally outwardly in a second direction and which lies in said first plane, said second direction being opposite said first direction;

wherein a third set of non-consecutive ones of said external leads each have a foot portion which extends laterally outwardly in said first direction and which lies in a second plane vertically spaced-apart form said first plane;

wherein a fourth set of non-consecutive ones of said external leads each have a foot portion which extends laterally outwardly in said second direction and which lies in said second plane;

wherein said first set of external leads is secured to a bottom surface of said cavity along a first side thereof;

wherein said second set of external leads is secured to said bottom surface of said cavity along a second side thereof opposite said first side thereof;

wherein said third set of external leads is secured to a first portion of a major surface of said substrate adjacent said first side of said cavity;

wherein said fourth set of external leads is secured to a second portion of said major surface of said substrate adjacent said second side of said cavity; and wherein said semiconductor device is supported in said vertical orientation by means of said external leads.

11. The combination as set forth in claim 10, wherein said substrate comprises a printed circuit board.

* * * * *